US010043959B2

(12) United States Patent
Jagt et al.

(10) Patent No.: US 10,043,959 B2
(45) Date of Patent: Aug. 7, 2018

(54) SUBSTRATE WITH REFLECTIVE COATING INCLUDING SILICATE OR ALKYLSILICATE NETWORK

(71) Applicant: KONINKLIJKE PHILIPS N.V., Eindhoven (NL)

(72) Inventors: Hendrik Johannes Boudewijn Jagt, Eindhoven (NL); Christian Kleijnen, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/586,120

(22) Filed: May 3, 2017

(65) Prior Publication Data
US 2017/0236987 A1    Aug. 17, 2017

Related U.S. Application Data

(62) Division of application No. 14/002,202, filed as application No. PCT/IB2012/051112 on Mar. 9, 2012, now Pat. No. 9,660,147.

(30) Foreign Application Priority Data

Mar. 18, 2011  (EP) .................................... 11158839

(51) Int. Cl.
H01L 33/60    (2010.01)
H01L 33/64    (2010.01)
H01L 33/62    (2010.01)

(52) U.S. Cl.
CPC .............. *H01L 33/60* (2013.01); *H01L 33/62* (2013.01); *H01L 33/641* (2013.01); *H01L 33/647* (2013.01); *H01L 2933/0058* (2013.01)

(58) Field of Classification Search
CPC ....... H01L 33/60; H01L 33/62; H01L 33/641; H01L 33/647
See application file for complete search history.

(56) References Cited

U.S. PATENT DOCUMENTS 6,845,184 B1    1/2005  Yoshimura et al.
2002/0021088 A1  2/2002  Webster et al.
(Continued)

FOREIGN PATENT DOCUMENTS

CN    1470577 A    1/2004
EP    1434271 A2   6/2004
(Continued)

OTHER PUBLICATIONS

JPO Office Action dated Aug. 8, 2017, Japan Patent Application No. 2013-558543, 20 pages.
(Continued)

*Primary Examiner* — Joseph L Williams
(74) *Attorney, Agent, or Firm* — Brian D. Ogonowsky; Patent Law Group LLP

(57) ABSTRACT

The present invention relates to a method for providing a reflective coating to a substrate for a light-emitting device, comprising the steps of: providing a substrate having a first surface portion with a first surface material and a second surface portion with a second surface material different from the first surface material; applying a reflective compound configured to attach to said first surface material to form a bond with the substrate in the first surface portion that is stronger than a bond between the reflective compound and the substrate in the second surface portion; curing said reflective compound to form a reflective coating having said bond between the reflective coating and the substrate in the first surface portion; and subjecting said substrate to a mechanical treatment with such an intensity as to remove said reflective coating from said second surface portion
(Continued)

while said reflective coating remains on said first surface portion.

8 Claims, 3 Drawing Sheets

(56) References Cited

U.S. PATENT DOCUMENTS

| | | |
|---|---|---|
| 2006/0012991 A1 | 1/2006 | Weaver et al. |
| 2006/0131602 A1 | 6/2006 | Ouderkirk et al. |
| 2009/0032829 A1 | 2/2009 | Chew et al. |
| 2009/0109688 A1 | 4/2009 | Hsu et al. |
| 2010/0279437 A1 | 11/2010 | Neff et al. |
| 2011/0049545 A1 | 3/2011 | Basin et al. |
| 2011/0233565 A1* | 9/2011 | Bierhuizen ......... H01L 25/0753 257/84 |
| 2012/0138997 A1 | 6/2012 | Tasaki et al. |
| 2013/0099276 A1 | 4/2013 | Fukushima et al. |

FOREIGN PATENT DOCUMENTS

| | | |
|---|---|---|
| EP | 2216834 A1 | 8/2010 |
| EP | 228841 A1 | 9/2010 |
| JP | 2007042668 | 2/2007 |
| JP | 2009141318 A | 6/2009 |
| JP | 2010135729 | 6/2010 |
| KR | 20090126824 A | 12/2009 |
| WO | WO-2009075530 A2 | 6/2009 |
| WO | WO-2010035206 A1 | 4/2010 |
| WO | WO-2010150880 A1 | 12/2010 |
| WO | WO-2012002580 A1 | 1/2012 |

OTHER PUBLICATIONS

EPO as ISA, PCT/IB2012/051112 filed Mar. 9, 2012, International Search Report and Written Opinion, dated May 30, 2012, 11 pages.
Extended European Search Report, Application No. 11158839.8, dated Aug. 12, 2011, 6 pages.
First Office Action, China Application No. 201280014057.6, dated Oct. 10, 2015, 13 pages.
Grant Decision, Russia Application No. 2013146546, dated Jun. 20, 2016, 5 pages (Translation only).
Office Action, European PCT Application No. 12710357.0, dated Aug. 3, 2016, 4 pages.
Office Action, Japan Application No. 2013-558543, dated Jul. 12, 2016, 5 pages.
Office Action, Japan Application No. 2013-558543, dated Dec. 15, 2015, 10 pages.
Office Action, Taiwan Application No. 101108935, dated Feb. 25, 2016, 8 pages.
Official Action, Russia Application No. 2013146546, dated Feb. 26, 2016, 4 pages (translation only).
Second Office Action dated Nov. 22, 2016, Chinese Patent Application No. 201280014057.6, 9 pages.
Korean Preliminary Rejection dated Apr. 11, 2018, Korean Patent Application No. 10-2013-7027446, 7 pages.

* cited by examiner

SUBSTRATE WITH REFLECTIVE COATING INCLUDING SILICATE OR ALKYLSILICATE NETWORK

CROSS-REFERENCE TO RELATED APPLICATIONS

The present application is a divisional of U.S. application Ser. No. 14/002,202 filed Aug. 29, 2013, entitled "METHOD FOR PROVIDING A REFLECTIVE COATING TO A SUBSTRATE FOR A LIGHT EMITTING DEVICE", which is a § 371 application of International Application No. PCT/IB2012/051112 filed on Mar. 9, 2012, which claims priority to European Patent Application No. 11158839.8 filed on Mar. 18, 2011. U.S. patent application Ser. No. 14/002,202, International Application No. PCT/IB2012/051112 and European Patent Application No. 11158839.8 are incorporated herein.

FIELD OF THE INVENTION

The present invention relates to a method for providing a reflective coating to a substrate for a light-emitting device. The present invention also relates to such a substrate and to a light-output device comprising such a substrate.

BACKGROUND OF THE INVENTION

Many LED chips of today are mounted on a ceramic substrate comprising mounting contacts and supply tracks for electrically driving the LED chip. The LED substrate package is usually soldered or glued to a Printed Circuit Board (PCB) for electrical connection to the contacts and supply tracks, and for thermal connection to the heat sink of a light emitting assembly. The mounting substrate is often of a high density polycrystalline ceramic having a relatively high thermal conductivity but relatively poor light reflectivity. A known measure for increasing the reflectivity of the ceramic is to increase the porosity of the ceramic. However, this simultaneously reduces the thermal conductivity considerably.

An attempt to solve these problems is provided in WO 2009/075530 disclosing a semiconductor package having LED-chips mounted on electrodes, which are arranged on a substrate. On top of the substrate, and next to the electrodes is provided a reflective coating comprising titanium dioxide, $TiO_2$, and a silicone binder. In order to achieve a reflective coating on top of the substrate and not on the electrodes, WO 2009/075530 proposes using a mask to protect the electrodes. However, this method appears to be complicated and time consuming, since it involves aligning a mask with the electrodes.

SUMMARY OF THE INVENTION

In view of the above-mentioned and other drawbacks of the prior art, an object of the present invention is thus to provide an improved method for providing a reflective coating to a substrate for a light-emitting device. The reflective coating is advantageous for enhancing the light-output of the LED package reducing light losses in the parts covered by the reflector. Also, as many light applications are prone to send at least part of the emitted light flux back to the LED packages, an improved reflectance of the packages also enhances the efficiency of the light system.

According to a first aspect of the present invention there is provided a method for providing a reflective coating to a substrate for a light-emitting device, comprising the steps of: providing a substrate having a first surface portion with a first surface material and a second surface portion with a second surface material different from the first surface material; applying a reflective compound configured to attach to the first surface material to form a bond with the substrate in the first surface portion that is stronger than a bond between the reflective compound and the substrate in the second surface portion; at least partly curing the reflective compound to form a reflective coating having the bond between the reflective compound and the substrate in the first surface portion; and subjecting the substrate to a mechanical treatment with such an intensity as to remove the reflective coating from at least a part of the second surface portion while the reflective coating remains on the first surface portion.

The present invention is based on the realization that the entire substrate may initially be covered with the reflective compound. By controlling the bond between the surface portions of the substrate and the reflective coating after at least partial curing, the reflective coating may be removed from the surface portions where it is desirable to have a clean and uncovered surface. Hereby, the reflective layer is patterned in a self-developing way on to the desired surface portions of the substrate. Advantages with the present invention include, for example, that the method for providing a reflective coating to desired portions of the substrate may be executed in a convenient and less time consuming manner, as the need of, for example, a mask for protecting portions of the substrate may be reduced. Furthermore, this may improve the reliability issues and contamination issues related to such mask processing. It also eliminates mask contamination and prevents spill in between the mask and the substrate, which can result in the coating covering parts of the substrate that needs to be uncovered.

According to an embodiment of the present invention, the method may further comprise the step of soaking the substrate in a solvent prior to subjecting the substrate to the mechanical treatment. An advantage is, for example, that the coating can be more easily removed from the second surface portion if exposed to soaking prior to the mechanical treatment.

According to an embodiment of the present invention, the reflective compound may comprise a sol-gel binder. The sol-gel binder has a relatively high thermal conductivity and provides a hard and scratch resistant coating on top of the substrate. Also, a sol-gel based binder can be arranged to adhere better to the ceramic substrate of the first surface portion than to the metal of the second surface portion, which further simplifies the removal of the coating from the second surface portion.

Moreover, the sol-gel binder may comprise an at least partly hydrolyzed silane monomer. The monomer may be partially condensed to form dimers, trimers, or more general oligmers of higher molecular weight. These precursor components are typically dissolved in a suitable solvent, but may also, partly, form small nano-particulate species dispersed in that solvent. An additional catalyst, such as an acid, may be present to facilitate hydrolysis and condensation. The monomer may further, for example, be methyltrimethoxysilane, methyltriethoxysilane, phenyltrimethoxysilane, phenyltriethoxysilane, tetramethoxysilane or tetraethoxysilane. In general, alkylalkoxysilanes or alkoxysilanes and/or partly condensed or prepolymerized versions of these materials or mixtures of these materials are suitable as material candidates. These silane monomers and pre-polymers are well known and are easy to provide. Furthermore, when the silane monomers are at least partly hydrolyzed, they form a silicate or alkylsilicate network after condensation. Such a silicate or alkylsilicate network has a material composition that adheres better to the first surface portion of the substrate than to the second surface portion of the substrate.

A silicate or alkylsilicate network refers to a network in which each silicon atom shares three oxygen atoms with a neighboring silicon atom, except for the end groups of the network. The general structural formula of such a silicate or alkylsilicate network is:

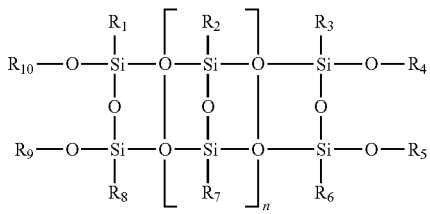

wherein "Si" is a silicon atom, "O" is an oxygen atom, and "R1"—"R10" is a hydrogen atom or an alkyl, alkenyl, alkoxy, aryl or a phenyl group. Silicate or alkylsilicate networks are different from silicones and pure silica. Silicones consist of linear chains with a backbone of (—Si—O—Si—O—)$_n$, and these materials are relatively flexible materials, with a relatively high thermal stability (typically 0.2 W m$^{-1}$ K$^{-1}$) and a relatively high coefficient of thermal expansion, the latter typically in the range of 250-350 ppm K$^{-1}$. Pure silica consists of a network in which each silicon atom is linked to four oxygen atoms that are shared with neighboring silicon atoms (except for the end groups), and layers made from this material are relatively glassy layers. The silicate or alkylsilicate networks are less dense than pure silica but more dense than the silicones, allowing to manufacture a relative thick coating layer (e.g. 50-100 μm) compared to pure silica but which is still relatively brittle and not flexible like a layer made from silicone. The thermal conductivity of the silicate or alkylsilicate materials are higher than that of silicones, typically about 1 W m$^{-1}$ K$^{-1}$, and the coefficient of thermal expansion is lower than that of silicone, typically in the range of 20-30 ppm K$^{-1}$. The latter matches better with the coefficient of thermal expansion of the ceramic support and the metal wiring of an LED. A reflective coating comprising a silicate or alkylsilicate network is relatively brittle and therefore the selective removal from that coating from the second surface portion of the substrate is enhanced since the reflective coating will break relatively easy at the edge of the first and the second surface portion of the substrate.

According to an embodiment of the present invention, the first surface material may be a ceramic material. Such a ceramic material may, for example, be aluminum oxide, $Al_2O_3$. An advantage is that such materials may have a high thermal conductivity, such as 20-30 W/mK for $Al_2O_3$, allowing heat, generated by a light-emitting device, to be transferred to, for example, a heat sink. By applying a reflector on the first surface portion of the substrate, the thermal conductivity may be optimized disregarding the reflective properties. For example, alumina may be sintered to a low porosity for enhancing thermal conductivity but substantially lowering its reflective properties. However, other materials may also be applicable for the first surface portion of the substrate, such as aluminum nitride, zirconia, zirconia toughened alumina, silicon, aluminum, etc.

Furthermore, the second surface material may be a metal, such as gold. A metal has a desirable electrical conductivity for electrically driving the light-emitting device. Also, a metal is desirable as it can be arranged to have a different bond to the reflective compound compared to the ceramic material of the first surface portion. However, other metals than gold may be provided for the second surface portion, for example, copper or silver. These materials may be present as a thin surface coating, for example, the gold is typically applied as a thin layer of sub-micron to a few micron thickness for cost saving, and is typically covering a cheaper thick copper layer, e.g. 10 to 100 micron thick. An intermediate adhesion layer between both layers may be present, such as nickel to bond gold to copper.

Still further, the second surface portion may comprise connection pads for electrical connection of a light-emitting device to the substrate. The electrical tracks on the surface may also be connected towards the backside of the substrate through via holes in the substrate. Additional tracks at the backside of the substrate than allow the soldering of the device at the rear side as a surface mountable device (SMD). Furthermore there may be additional connection pads and tracks for attaching other electrical components used in the device, such as transient voltage suppressors, resistors, rectifiers, inductors, capacitors, diodes, integrated circuits, photodiodes or other sensoric functions.

According to an embodiment of the present invention, the bond between the first surface portion and the reflective compound is a chemical bond. An advantage is, at least, that a chemical bond can be controlled such that the reflective compound adheres better to the first surface portion than to the second surface portion. For example, the sol-gel binder can interact with the alumina substrate to form the chemical bond, while there is no such bond between the gold layer and the sol-gel binder.

Furthermore, according to an embodiment of the present invention, the reflective compound may be applied by spraying. Hereby, the reflective compound may be provided to the substrate in a uniform and controlled manner Alternative methods of deposition include other coating or printing techniques, such as screen printing, curtain coating, spin coating, blade coating, dip coating, inkjet printing, stencil printing, offset printing, etc.

Moreover, the curing may be a thermal process. As an example, the thermal process may be executed between 10 to 50 minutes at a mild temperature interval of 60° C. to 100° C., preferably between 20 to 40 minutes at a temperature interval of 70° C. to 90° C., and more preferably for 30 minutes at a temperature of 80° C. Final curing of the coating may occur after detach of the reflective coating from at least a part of the second surface portion.

Furthermore, the mechanical treatment may have substantially the same intensity in the first surface portion and in the second surface portion. Hereby, the removal of the reflective coating may be executed in a uniform manner, and thereby reduces the need of an individual treatment of the second surface portion.

According to a second aspect of the present invention there is provided a substrate adapted to be provided with a light-emitting device, comprising: a carrier; a conductor pattern for electrically connecting a light-emitting device to the substrate; and a reflective coating provided on the substrate comprises pigment and a silicate network or alkylsilicate network, wherein the network is arranged to provide a bond between the reflective coating and the carrier, and wherein the conductor pattern is at least partly uncovered by the reflective coating The light-emitting device is typically a solid state light emitter such as a light-emitting diode (LED), a laser diode (LD) or a vertical cavity surface emitting laser (VCSEL). The light-emitting device, such as an LED may omit colored light, such as blue, green, red, yellow or amber, or may even omit UV-light or IR-light. The LED chip as well as the substrate may be covered with a phosphor layer to convert typically UV or blue light to other colors, or even to mixed white light. The reflector than serves the function to enhance light extraction and reduce light loss of the light generated by the LED dies as well as the phosphor.

The light emitting device may refer to a chip or die element that is bonded to the contact areas of the substrate with suitable bonding techniques. Alternatively the light emitting device may also refer to a packaged LED component, typically consisting of an LED die attached to a carrier substrate, with optional further packaging with a phosphor layer and as light extraction layer such as a dome. This carrier substrate may be a ceramic, or may be silicon, a PCB or a metal core PCB. The carrier substrate has bonding pad connections to electrically connect the device to the second surface portion of the substrate.

Furthermore, the reflective coating may be provided between the carrier and the conductor pattern. Hereby, the reflective coating may be provided to the carrier prior to applying the conductor pattern. The conductor pattern enables the light-emitting device to be electrically connected to the substrate in a desired manner.

According to an embodiment, the bond between the reflective coating and the carrier is a chemical bond.

The substrate according to the various embodiments may preferably be provided as a component of a light-output device further comprising at least one light-emitting device mounted on the substrate.

Furthermore, the light-emitting device may comprise at least one light emitting diode chip.

Effects and features of this second aspect are largely analogous to those described in relation to the above mentioned first aspect of the present invention.

BRIEF DESCRIPTION OF THE DRAWINGS

These and other aspects of the present invention will now be described in more detail, with reference to the appended drawings showing example embodiments of the invention, wherein.

DESCRIPTION OF EXAMPLE EMBODIMENTS OF THE PRESENT INVENTION

In the following description, the present invention is described with reference to a method for providing a reflective coating to a ceramic substrate for a light emitting device. A reflective compound is provided on top of a substrate having metallic connection pads for electrically connecting a light-emitting device thereto. The reflective compound is exposed to a curing process and thereafter removed from the connection pads of the substrate. The following will also describe the substrate provided by the method.

It should be noted that this by no means limits the scope of the present invention, which is equally applicable with other substrate materials, such as, aluminum nitride, silicon, aluminum, etc. In the case of a metal substrate, such as aluminum, a dielectric layer can be formed between the substrate and the metal tracks to electrically shield the metal electrodes from the conductive substrate. Also, the metallic connection pads and the metal tracks do not necessarily have to be built up by three layers of different metallic materials; the invention is equally applicable with only a single or dual layer of material or may include even more layers.

Figure 1:
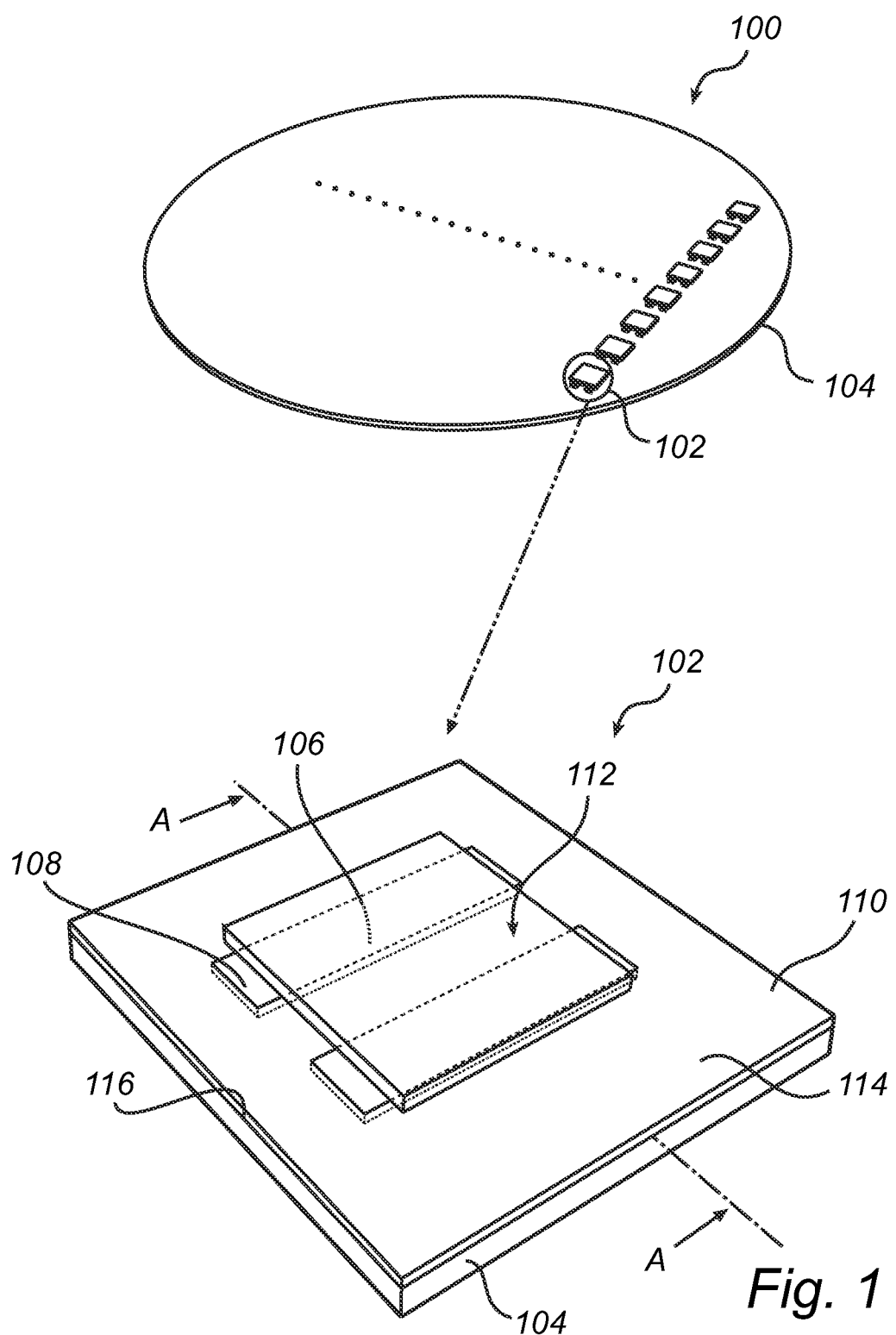
FIG. 1 schematically illustrates a perspective view of a light-output device according to an embodiment of the present invention.

FIG. 1 schematically illustrates a wafer 100 comprising a plurality of light-output devices 102, where each light-output device 102 has a substrate 104, metallic connection pads 106 and metal tracks 108. The wafer may be squared but may also come in other shapes, such rectangular or round. In more detail, each light-output device 102 comprises a substrate 104 having on its upper surface 110 the metallic connection pads 106 and metal tracks 108 for electrically driving a light-emitting device 112, which is arranged onto the metallic connection pads 106 of the substrate. The area/space between the light emitting device 112 and the upper surface 110 may be filled-up with a filler material to support the device 112. The filler may be the reflective coating 114 or cover the reflective coating 114. The substrate 104 is, in the described embodiment, of a ceramic material, such as aluminum oxide, $Al_2O_3$. The substrate 104 has a desired thermal conductivity and can therefore act as a heat spreader for conducting away the heat generated by the light-emitting device (typically one or several light-emitting diodes—LEDs). Furthermore, on a first surface portion 116 of the substrate 104, which is not provided with metallic connection pads 106 and metal tracks 108, there is provided a reflective coating 114 which is arranged to reflect the light emitted by the light-emitting device 112 thereon. Moreover, the reflective coating 114 comprises, in the illustrated embodiment, pigments, a binder and additional fillers. The pigments are arranged to provide a desired reflective characteristic of the coating and are in the illustrated embodiment of a titanium dioxide material, having a particle size distribution in the range between 100-1000 nm. The pigment gives rise to scattering in the coating. By optimizing the amount of pigment with respect to the binder and selecting pigments and binders with large refractive index differences, a highly scatter, hence reflective coating may be realized if appropriate coating thickness is used. The amount of reflectance may be tuned. It is typically desirable to achieve a high reflectivity, such to achieve a reflectance higher than 80%, preferably higher than 90%, more preferably higher than 95%. A typical layer thickness for the reflective coating ranges from about 1 micron to about 100 micron. A thicker layer typically leads to a higher reflectance. The binder of the reflective compound is arranged to provide a chemical bond between the coating 114 and the first surface portion 116, such that the coating 114 adhere to the first surface portion 116 in a desired manner. The binder is, in the illustrated embodiment, preferably a sol-gel based binder, derived from a silane monomer. The monomers are at least partly hydrolyzed prior to being provided to the substrate. Typical silane monomers may, for example, be methyltrimethoxysilane, methyltriethoxysilane, tetraethoxysilane, phenyltrimethoxysilane or alkylalkoxysilanes, etc. Still further, typical additional filler may, for example, be silicon dioxide particles, alumina particles or titanium dioxide particles in the size of approximately 5-100 nm, which are arranged to reduce shrinkage of the coating 114 in a curing phase which will be further described below in relation to the method for providing the coating to the substrate 104.

Figure 2:
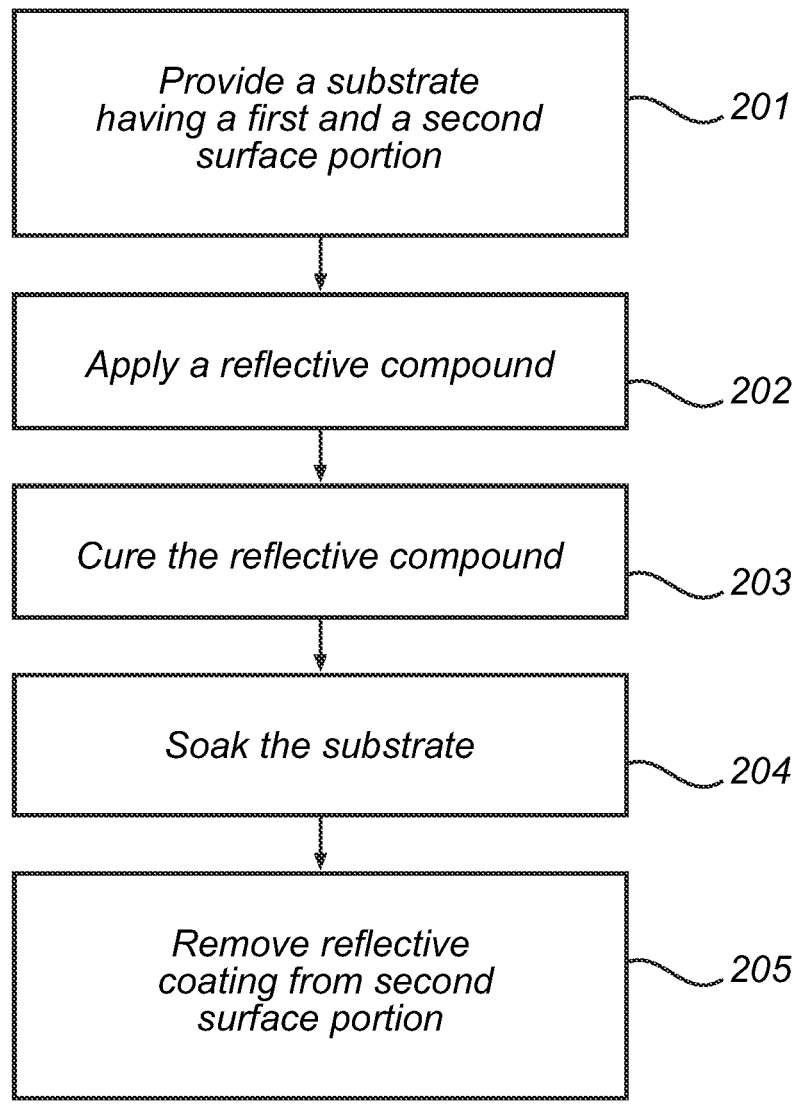
FIG. 2 is a flow-chart schematically illustrating an embodiment of the method for providing a reflective coating to a substrate according to the present invention.

An example embodiment of the method according to the present invention for providing the reflective coating to the substrate will now be described with reference to FIG. 2, illustrating a flow-chart of the method. It should be noted that the method is described without a light-emitting device 112 arranged onto the metallic connection pads 106. This should, however, not be interpreted as limiting the scope of the application, which may also be applicable with a light-emitting device 112 arranged onto the metallic connection pads 106 in connection to the first step 201 of the method.

Figure 3:
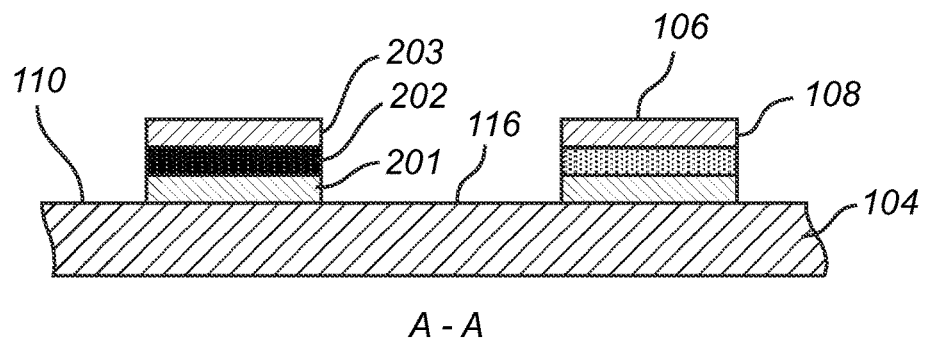
FIG. 3 schematically illustrates an embodiment of a substrate having connection pads arranged thereto.

According to the first step 201 of the method, the metallic connection pads 106 and metal tracks 108 are arranged on the top surface 110 of the substrate 104, which is illustrated in detail by FIG. 3. Furthermore, the metallic connection pads 106 and the metal tracks 108 are, in the illustrated embodiment, built up by a copper layer 201 coated with a nickel layer 202 and a gold layer 203, where the gold layer 203 is provided on the top surface 110 of the metallic connection pads 106 and metal tracks 108, for electrically driving a light-emitting device 112 arranged thereto as illustrated in FIG. 1. Alternatively, the gold layer may also cover the copper conformably, hence also covering the side faces of the metallic connection pads 106 and the metal tracks 108.

Figure 4:
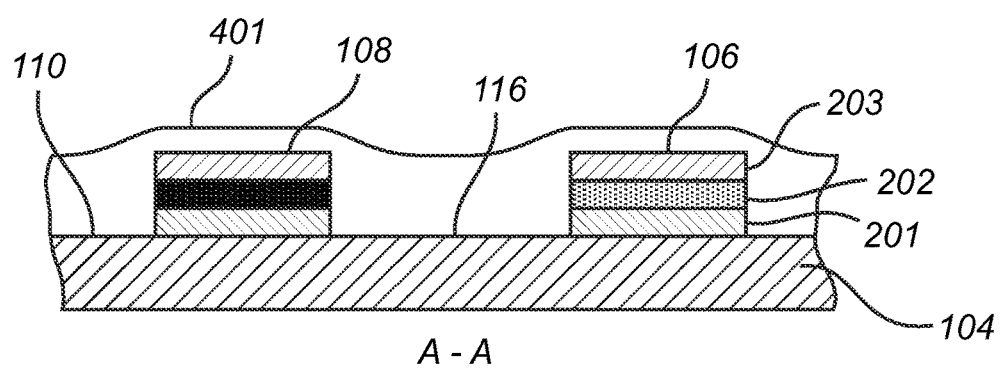
FIG. 4 schematically illustrates the embodiment of FIG. 3 having a reflective compound applied thereto.

Now referring to the second step 202 of the method, also illustrated in FIG. 4. A reflective compound 401 is provided on the top surface 110 of the substrate 104, including on the metallic connection pads 106 and the metal tracks 108. The reflective compound 401 may be provided by, for example, spray coating the substrate 104 at a predetermined speed, in the illustrated embodiment at, for instance, a speed of 10 mm/s. The substrate 104, the metallic connection pads 106 and the metal tracks 108 are thus, after the second step 202, at least partly covered with the reflective compound 401. The reflective compound comprises pigments, a binder and additional filler as described in relation to FIG. 1. Also, the reflective compound 401 further comprises a solvent, for example, water or other solvents such as ethanol, isopropanol or butanol. The spray layer may be applied on the total substrate area, but may also be applied on only a part of the substrate area. After the coating, the substrate is dried to remove at least a part of the solvents.

Thereafter, at the third step 203, the reflective compound 401 is at least partially cured at a predetermined temperature during a predetermined time, forming a reflective coating 114 on the substrate 104, the metallic connection pads 106 and the metal tracks 108. The at least partial curing is, in the illustrated embodiment, a thermal process where the compound 401 is heated in 30 minutes at a temperature of approximately 80° C. When being exposed to the curing phase, the silane monomers or pre-polymers of the sol-gel binder will react to a silicate network or an alkylsilicate network, forming a cross linking of the binder. Preferably, the sol-gel binder forms a methylsilicate network, which may adhere in a desired manner to the ceramic substrate of the first surface portion 116 of the substrate, but may adhere less to the top surface 203 of the metallic connection pads 106 and the metal tracks 108. This is accomplished since a chemical bond between the sol-gel binder and the alumina substrate is formed. However, a difference in surface roughness can also provide the reflective coating to adhere better to the ceramic substrate than to the metallic connection pads 106 and the metal tracks 108. For example, the ceramic substrate can be relatively rough to provide an area for anchoring of the reflective coating, while the metallic connection pads 106 and the metal tracks 108 have a less roughened surface. Furthermore, the sol-gel binder may be configured such that it adheres in a desired manner to the copper 201 and nickel 202 materials of the metallic connection pads 106 and the metal tracks 108 as well. Still further, according to an embodiment, the reflective coating 114 may have a composition comprising between 10-60 v % pigments with the remaining part formed by the binder.

Optionally, an additional filler may be present, such as in between 0-30 v %. For example, the composition may be 20 v % nano-$SiO_2$, 30 v % methylsilicate binder and 50 v % $TiO_2$. The coating may also include pores, not represented in the mentioned volume percentage, which can also contribute to the scattering. Moreover, if it is desired to increase the thickness of the reflective coating 114, such as to enhance reflectance or surface uniformity or surface planarity, the first 201, second 202 and third 203 steps described above may be repeated until a satisfactory amount of reflective coating 114 is applied to the substrate 104.

After curing the compound, i.e. after the third step 203 of the method, the substrate is exposed to a soaking phase, i.e. the fourth step 204 of FIG. 2. The substrate 104 is thus exposed to a solvent, for example, water and/or acetone, which may further reduce the bond between the reflective coating 114, and the metallic connection pads 106 and the metal tracks 108. The solvent may contain an etchant for the metal pads, such as an acid, to facilitate coating release.

Figure 5:
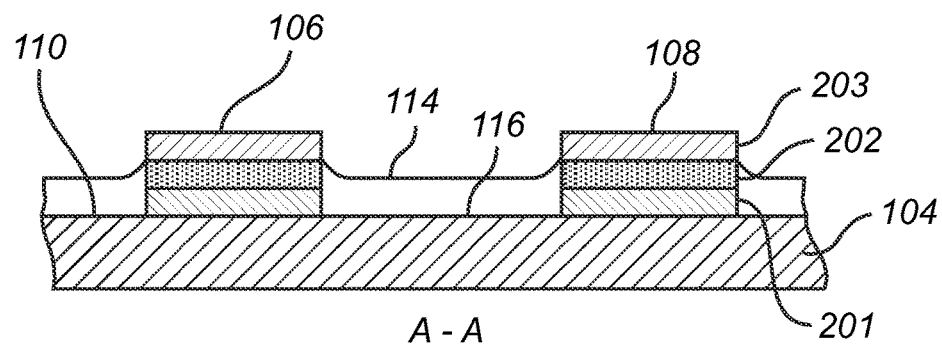
FIG. 5 schematically illustrates the embodiment of FIG. 4, wherein the reflective coating has been removed from the connection pads.

Now referring to FIG. 5, illustrating the fifth step 205 of the method, i.e. the removal of the reflective coating 114 from the metallic connection pads 106 and the metal tracks 108. At this stage, the substrate 104 is exposed to a mechanical treatment, such as a fluid spray pressure, which removes the reflective coating 114 from the metallic connection pads 106 as well as from the metal tracks 108. However, due to the chemical bond between the sol-gel binder of the reflective coating 114 and the ceramic substrate 104, as described above, the reflective coating 114 is not removed from the ceramic substrate 104 when being subjected to the mechanical treatment. Hence, as is illustrated in FIG. 5, the ceramic substrate 104 is coated with the reflective coating 114 while the metallic connection pads 106 and the metal tracks 108 have a "clean" surface for providing a desired electrical connection to a light-emitting device 112 connected thereto.

According to an embodiment of the invention, and in order to further increase the reflectivity of the substrate 110, the metal tracks 108 may also be provided with the reflective coating 114 after the fifth step 205 of the method. In such a case, at least part of the metal tracks 108, which are not to be in connection to the light-emitting device 112 after assembly, may be provided with an adhesion promoter prior to applying the reflective compound 401 as illustrated in the second step 202 of the method as well as in FIG. 4. A way to achieve this is to pre-pattern the substrate with a pattern made in a photo-resist layer. The photo-resist layer is covering the areas that should not be covered with the adhesion promoting layer. Subsequently, the adhesion promoting layer is applied, for example, by dipping the substrate in a bath containing the adhesion promoter dissolved in a solvent. The adhesion promoter may for instance be 3-mercaptopropyltrimethoxysilane, from which the mercapto group reacts with e.g. gold, and the methoxy groups can be chemically linked to the silicate or alkylsilicate network. Hereby, the chemical bond between the metal tracks 108 and the reflective coating 114 may be increased in order to sustain the fourth 204 and fifth step 205 as described above, in the same manner as the first surface portion 116.

Additionally, variations to the disclosed embodiments can be understood and effected by the skilled person in practicing the claimed invention, from a study of the drawings, the disclosure, and the appended claims. For example, the pigment used in the reflective coating may, instead of titanium dioxide of either rutile $TiO_2$ or anatase $TiO_2$ type, be one of alumina, zirconia, hafnium oxide, yttrium oxide or tantalum oxide, barium titanate, strontium titanate, or a mix of such pigments etc. Moreover, the adhesion promoter applied to the metal tracks may further also comprise, for example, a dipping procedure or a stripping procedure. Still further, the mechanical treatment for removing the reflective coating from the metallic connection pads may also comprise brushing, grinding, jetting, or ultrasonic, megasonic etc. To further facilitate the removal of the coating from the metal tracks the surface may be pre-treated with a release layer. The release layer may be removed after coating release to achieve a reliable contact area for the light emitting device. The release layer may be a thin layer, such as a self-assembled monolayer of functionalized thiols. The thiol groups are known to adhere to gold, the functional group may provide non-stick properties. The release layer may be removed afterwards, by for instance, an oxygen plasma treatment. The release layer may also be a suitable photo-resist or other release layer provide on the metal tracks.

Also, the material composition of the reflective coating may have a composition comprising a variation of: 10-90 v % cured sol-gel, 10-60 v % titanium dioxide pigment filler and 0-40 v % nano-silicon dioxide filler. More preferably, the composition is 20-50 v % binder, 30-50 v % pigment and 10-20 v % nano filler.

Furthermore, a photo-resist pattern may cover the metal tracks and the metallic connection pads at the areas that are to be covered by the reflective coating. The areas that are not to be covered with the reflective coating may then be treated with a releasing layer that reduces the adhesion. After removal of the photo-resist the coating process is performed resulting in coating release from the pre-patterned release layer only. Still further, the substrate carrier may also be a printed circuit board or a laminate, e.g. a multi-layer printed circuit board. Thus, the carrier may consist of multiple layers, and the substrate surface does not necessarily have to consist of only one material type but may also be covered with various materials.

Moreover, other substances than water or acetone may be used in the soaking phase for enabling a simplified removal of the reflective coating, for example, methyl acetate, ethyl acetate, butyl acetate, ethanol, isopropanol or other alcohols etc.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage.

The invention claimed is:

1. A substrate adapted to be provided with a light-emitting device, comprising:
    a carrier;
    a conductor pattern forming metallic connection pads having a top surface configured to be electrically connected to a light-emitting device; and
    a reflective coating provided on said substrate and comprising pigment and a silicate or alkylsilicate network, wherein said network is arranged to provide a bond between said reflective coating and said carrier,
    wherein the reflective coating is self-aligned with the connection pads such that the reflective coating directly abuts edges of the connection pads and does not cover any portion of the top surface of the connection pads.

2. The substrate according to claim 1, wherein said reflective coating is provided between said carrier and said conductor pattern.

3. The substrate according to claim 1, wherein said bond is a chemical bond.

4. The substrate according to claim 1, wherein the substrate comprises a ceramic surface to which said network adheres.

5. A light-output device comprising:
    a substrate according to claim 1, and
    at least one light-emitting device mounted on said substrate.

6. The light-output device according to claim 5, wherein said light-emitting device comprises at least one light-emitting diode chip.

7. The substrate according to claim 1 wherein the reflective coating is self-aligned with the connection pads due to the reflective coating being initially deposited over the connection pads and the carrier, wherein the bond between the reflective coating and the carrier is greater than a bond between the reflective coating and the top surface of the connection pads, allowing the reflective coating to be removed from the top surface of the connection pads without removing the reflective coating from the carrier.

8. The substrate according to claim 1, wherein the reflective coating is provided on the carrier between the connection pads.

* * * * *